United States Patent
Ahn et al.

(10) Patent No.: US 11,621,382 B2
(45) Date of Patent: Apr. 4, 2023

(54) ANODIC OXIDE FILM FOR ELECTRIC CONTACT, OPTOELECTRONIC DISPLAY, AND METHOD OF MANUFACTURING OPTOELECTRONIC DISPLAY

(71) Applicant: POINT ENGINEERING CO., LTD., Asan (KR)

(72) Inventors: Bum Mo Ahn, Suwon (KR); Seung Ho Park, Hwaseong (KR); Dong Hyeok Seo, Asan (KR)

(73) Assignee: POINT ENGINEERING CO., LTD., Asan (KR)

( * ) Notice: Subject to any disclaimer, the term of this patent is extended or adjusted under 35 U.S.C. 154(b) by 97 days.

(21) Appl. No.: 16/889,612

(22) Filed: Jun. 1, 2020

(65) Prior Publication Data

US 2020/0388737 A1 Dec. 10, 2020

(30) Foreign Application Priority Data

Jun. 4, 2019 (KR) .......................... 10-2019-0065992

(51) Int. Cl.
| | |
|---|---|
| H01L 29/18 | (2006.01) |
| H01L 33/00 | (2010.01) |
| H01L 29/20 | (2006.01) |
| H01L 33/62 | (2010.01) |
| H01L 25/13 | (2006.01) |

(52) U.S. Cl.
CPC .............. *H01L 33/62* (2013.01); *H01L 25/13* (2013.01)

(58) Field of Classification Search
CPC ..... H01L 33/62; H01L 25/13; H01L 25/0753; H01L 27/156; H01L 33/387; H01L 2933/0066; H01L 21/28026; H01L 21/7685; H01L 21/76846; H01L 21/02614; H01L 24/12; H01L 24/04; H01L 24/28; H01L 33/0093
See application file for complete search history.

(56) References Cited

U.S. PATENT DOCUMENTS

| | | | |
|---|---|---|---|
| 5,262,226 A * | 11/1993 | Yoshida ................. | H01R 12/52 428/209 |
| 9,698,134 B2 | 7/2017 | Li et al. | |
| 2004/0241932 A1* | 12/2004 | Souriau ............... | H01L 23/5328 438/222 |
| 2006/0249834 A1* | 11/2006 | Uang ...................... | H01R 4/04 257/700 |
| 2009/0166664 A1* | 7/2009 | Park ...................... | H01L 33/486 257/E21.154 |
| 2011/0095419 A1* | 4/2011 | Horiuchi ............... | H01L 21/486 427/97.8 |
| 2011/0254029 A1 | 10/2011 | Lai | |
| 2014/0182906 A1* | 7/2014 | Hu .................... | H01L 23/49827 174/258 |
| 2015/0243854 A1* | 8/2015 | Inoue .................... | H01L 33/504 257/98 |

(Continued)

*Primary Examiner* — Ismail A Muse

(57) ABSTRACT

The present invention relates generally to an anodic oxide film for electric contact, to an optoelectronic display, and to a method of manufacturing the optoelectronic display. More particularly, the present invention relates to an anodic oxide film for electric contact to electrically connect an optical element and a substrate in a position therebetween, to an optoelectronic display, and to a method of manufacturing the optoelectronic display.

12 Claims, 13 Drawing Sheets

(56) References Cited

U.S. PATENT DOCUMENTS

| | | | | |
|---|---|---|---|---|
| 2016/0190398 A1* | 6/2016 | Nam | .................... | H01L 33/486 |
| | | | | 257/99 |
| 2016/0336262 A1* | 11/2016 | Yamashita | ............. | H05K 1/115 |
| 2017/0372994 A1* | 12/2017 | Katkar | .............. | H01L 23/49833 |
| 2018/0046013 A1* | 2/2018 | Jiang | ................. | G02F 1/133602 |
| 2019/0066571 A1* | 2/2019 | Goward | ............ | H01L 23/49827 |
| 2019/0214537 A1* | 7/2019 | Ahn | ........................ | H01L 24/83 |
| 2020/0122197 A1* | 4/2020 | Ahn | ..................... | H01L 41/047 |
| 2020/0152845 A1* | 5/2020 | Lee | .................... | H01L 25/0753 |
| 2020/0168551 A1* | 5/2020 | Yamashita | ............. | H01R 43/00 |
| 2021/0363653 A1* | 11/2021 | Hotta | ................ | H01L 23/49816 |

* cited by examiner

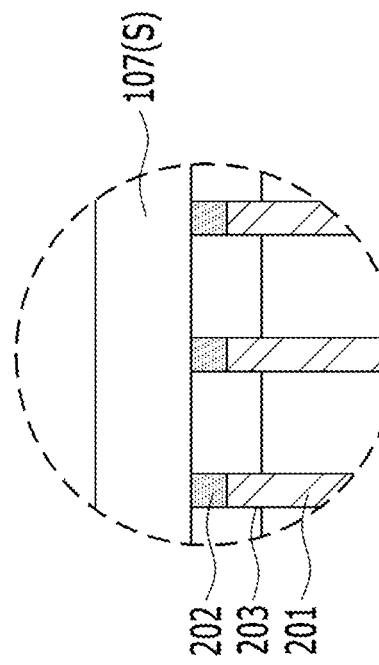
Fig. 6A
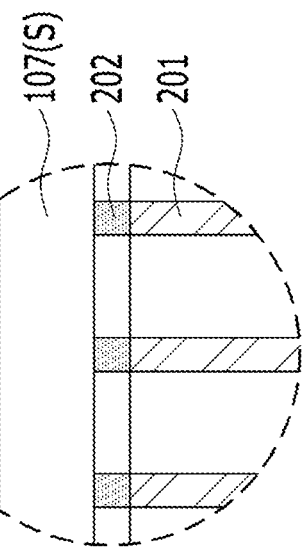
Fig. 6B
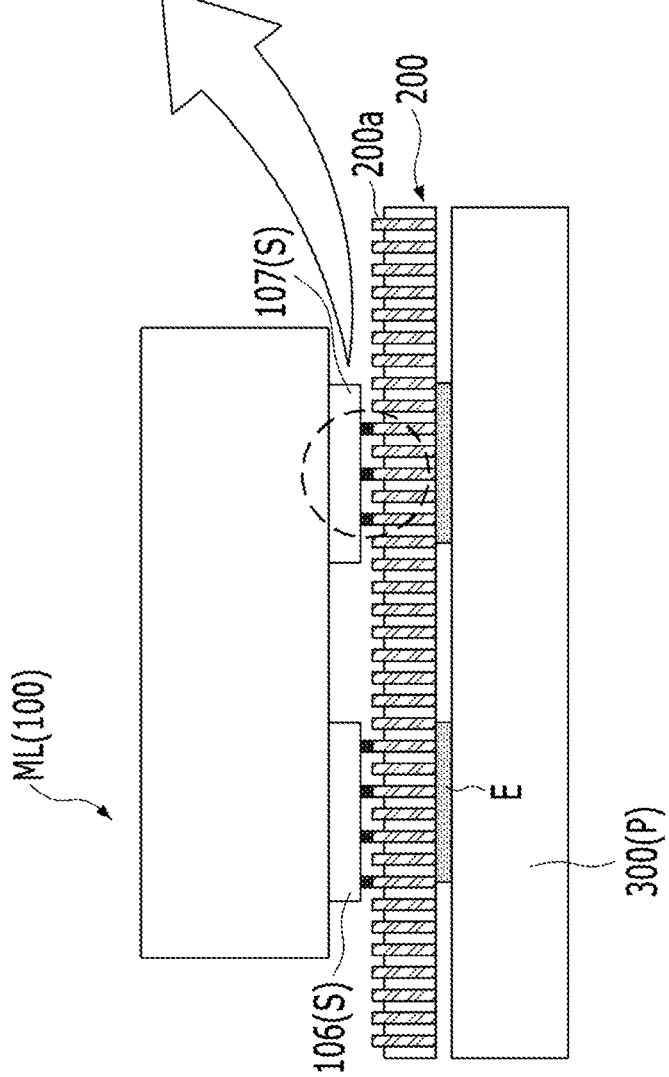

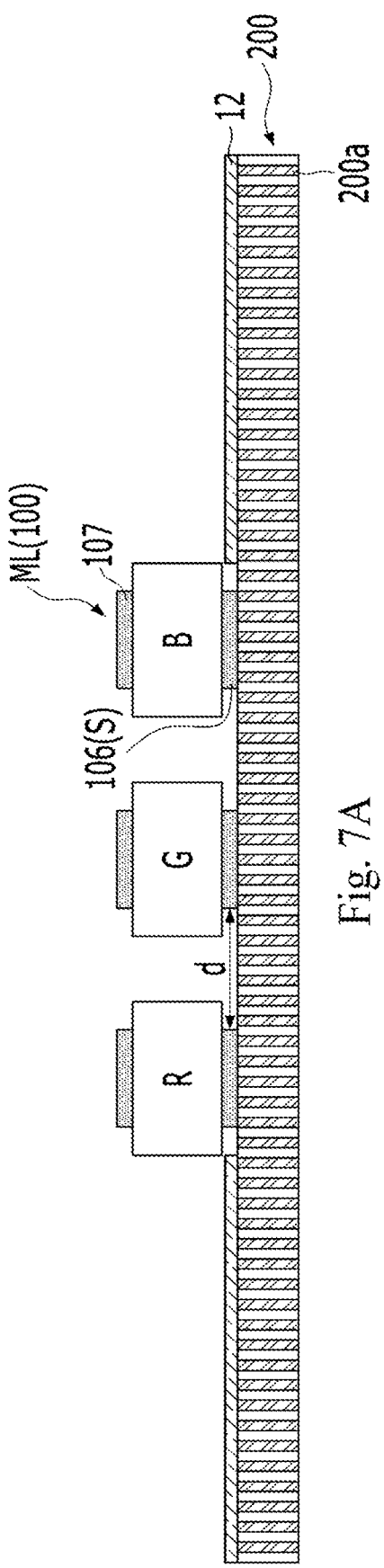
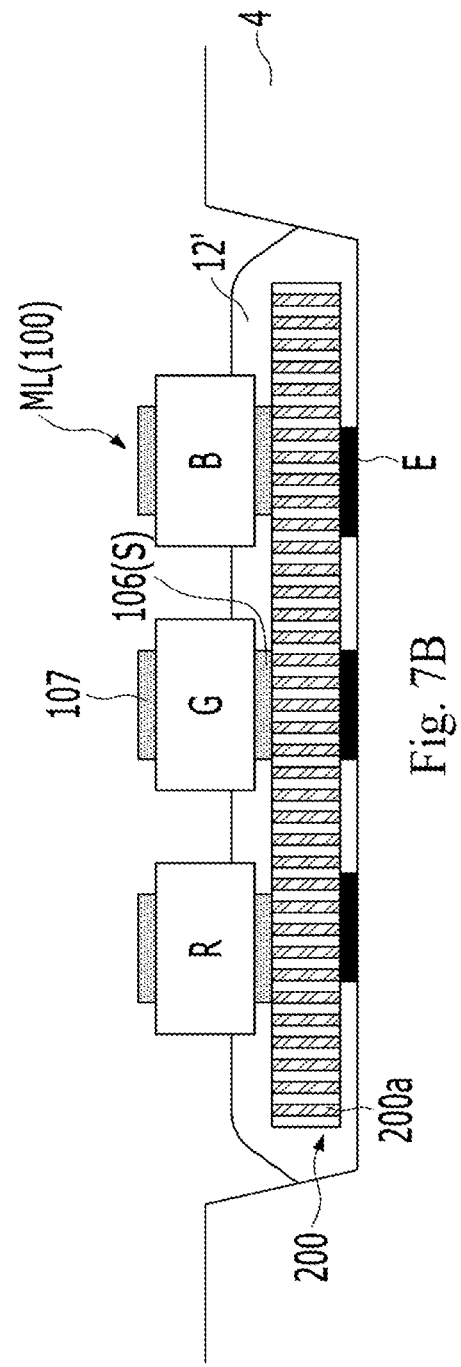
Fig. 7A
Fig. 7B

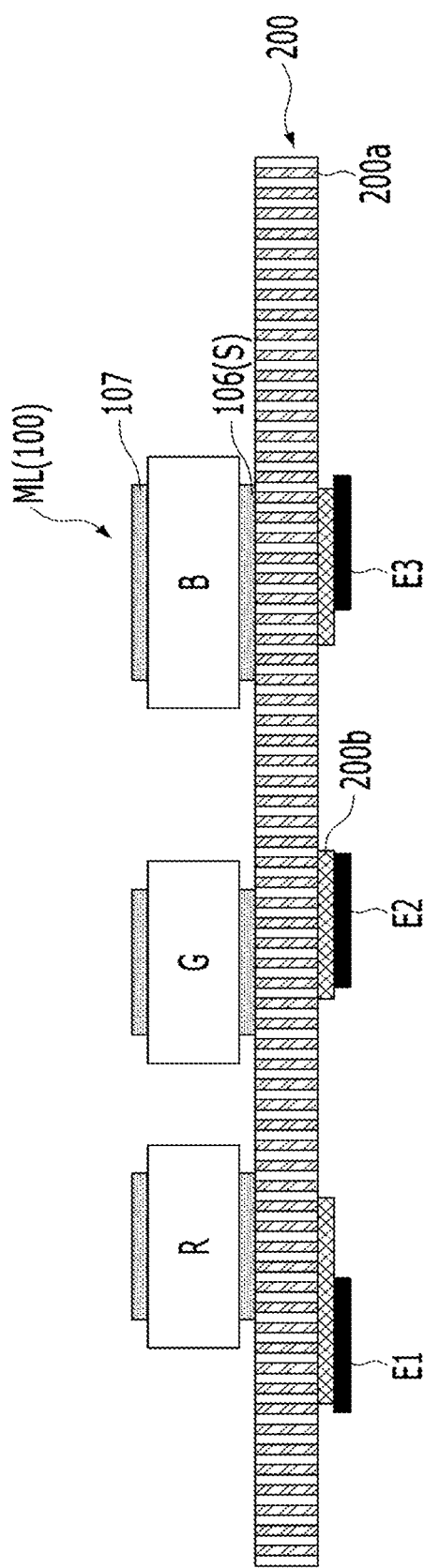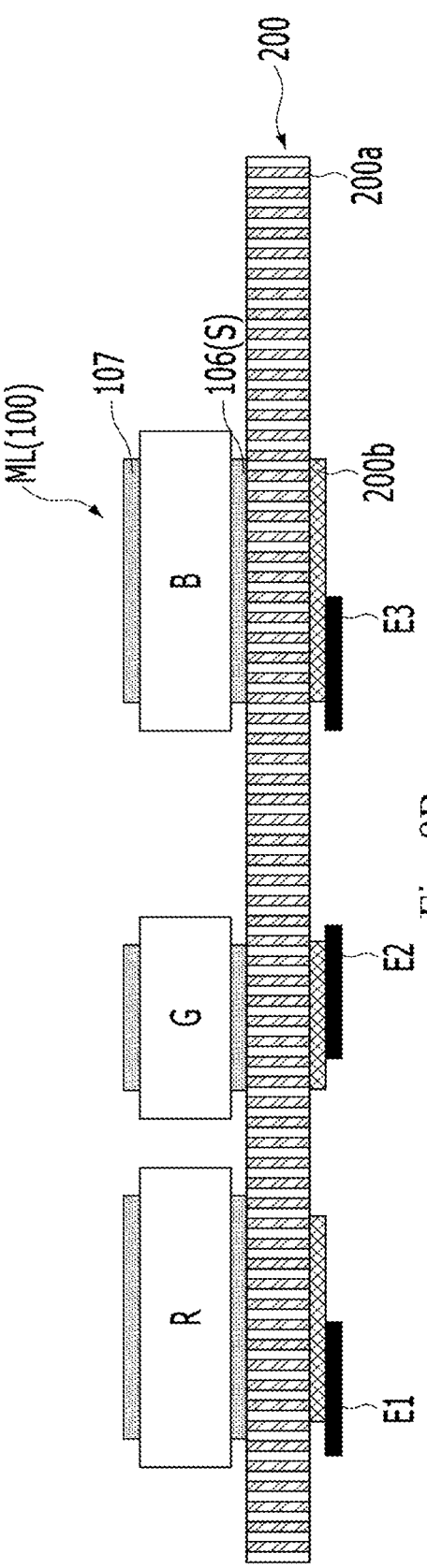
Fig. 8A
Fig. 8B

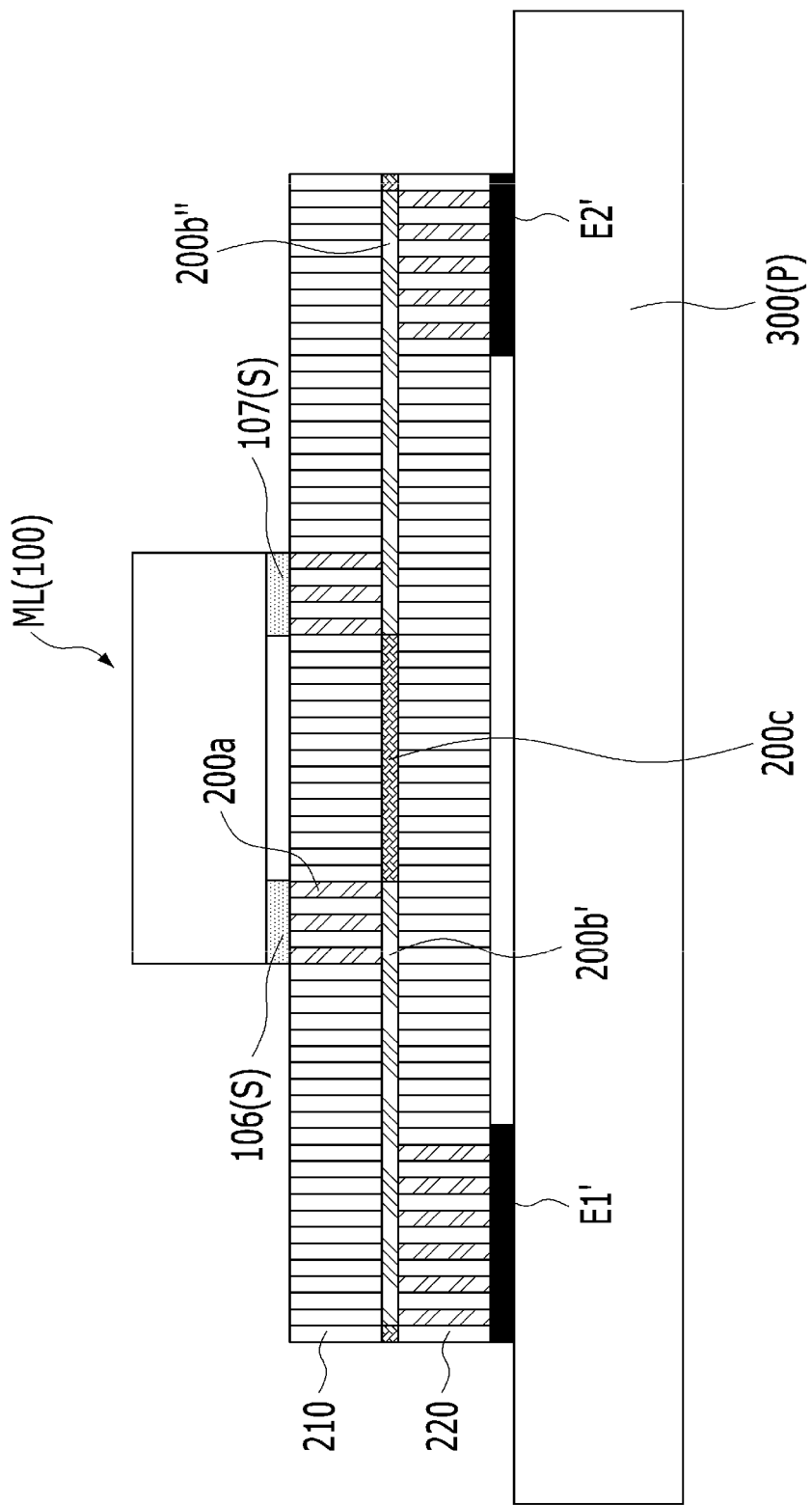

ANODIC OXIDE FILM FOR ELECTRIC CONTACT, OPTOELECTRONIC DISPLAY, AND METHOD OF MANUFACTURING OPTOELECTRONIC DISPLAY

CROSS REFERENCE TO RELATED APPLICATION

The present application claims priority to Korean Patent Application No. 10-2019-0065992, filed Jun. 4, 2019, the entire contents of which is incorporated herein for all purposes by this reference.

BACKGROUND OF THE INVENTION

Field of the Invention

The present invention relates to an anodic oxide film for electric contact to electrically connect an optical element and a substrate, to an optoelectronic display, and to a method of manufacturing the optoelectronic display.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next generation display. The micro LED is not a package type covered with molded resin or the like but a piece obtained by cutting out a wafer used for crystal growth. Liquid crystals and organic materials are the core materials of LCDs and OLEDs, respectively, whereas the micro LED display uses 1 to 100 μm of LED chips as a light emitting material.

The micro LED may be joined to a substrate constituting the micro LED display. FIG. 1A is a view illustrating a substrate P constituting a micro LED display. As illustrated in FIG. 1A, a plurality of pixel areas F may be formed on the substrate P. In the pixel areas F, an electrode E that is joined to a terminal of a micro LED ML may be provided. As one example, in one pixel area F, three electrodes E that are joined to micro LEDs MLs of red R, green G, and blue B may be provided to form a minimum pixel unit.

As a method of joining the micro LEDs to the substrate P, as one example, eutectic bonding may be used. Eutectic bonding is a method in which a solder bump is provided on each of the electrodes E of the substrate P and the solder bump is melted to join the micro LEDs MLs to the substrate.

FIG. 1B is an enlarged view illustrating a part of the micro LEDs MLs joined to one pixel area F of the substrate P by a eutectic bonding process. In FIG. 1B, as one example, it is illustrated that vertical-type micro LEDs MLs each of which has a first terminal 106 provided at the bottom and a second terminal 107 provided at the top is provided, and an electrode E of the substrate P and the first terminal 106 of the micro LED ML are joined by a solder bump 10. The solder bump 10 may function as a joining layer for joining the electrode E of the substrate P and the first terminal 106 of the micro LED ML. The letter 'd' illustrated in FIG. 1B denotes a separation distance between the micro LEDs MLs defined by the distance between the respective first terminals 106 of the micro LEDs MLs.

The micro LED ML is formed in a very small tens of micrometers in size, and the distance d between the micro LEDs MLs in one pixel area F is very short. Thus, it is difficult to precisely perform alignment of the micro LED ML with respect to the electrode E provided in the pixel area F as shown in FIG. 1B.

FIG. 1C is a view illustrating a state in which the micro LED ML is misaligned with respect to the electrode E of the substrate P. In this case, the micro LED ML may be tilted as in the state illustrated second from the left in FIG. 1C, which is undesirable. As such, the micro LED ML may be difficult to precisely align with respect to the electrode E of the substrate P due to the small size thereof, and when misalignment occurs as illustrated in FIG. 1C, the problem of undesired tilting of the micro LED ML may occur. As a result, this may cause defects in the micro LED display.

Additionally, since the respective micro LED ML provided in one pixel area F have a short separation distance, an electrical short problem may occur due to overflow of the solder bump 10 melted by heat.

Each of the micro LEDs MLs joined to the substrate P may be, as illustrated in FIGS. 1A, 1B, and 1C, a vertical-type micro LED as one example, and as another example, a flip-type micro LED in which all terminals (first terminal 106 and second terminal 107) are provided on at least any one side. Thus, the meaning of a 'terminal S' mentioned below may vary depending on the types of micro LEDs provided. In the case of the vertical-type micro LED, the terminal S may denote a first terminal 106 provided at the bottom. On the other hand, in the case of the flip-type micro LED, the terminal S may denote both first and second terminals 106 and 107 provided on any one side.

FIG. 2A is a view illustrating a state in which each flip-type micro LED ML is joined by the use of solder bumps 10 provided as joining layers on electrodes E. In FIG. 2A, as one example, the first and second terminals 106 and 107 are illustrated and described as being provided at the bottom of the micro LED ML. The letter 'd'' illustrated in FIG. 2A and FIG. 2B, which will be described later, denotes a separation distance between terminals S of the flip-type micro LED ML.

In the case of the flip-type micro LED ML, a plurality of terminals S may be provided within a horizontal area range of the micro LED ML of a very small size. Thus, the separation distance d' between the respective terminals S is very short. Also in this case, as in the problem of the vertical-type micro LED ML described above, precise alignment of the micro LED with respect to the electrodes E of the substrate P may be difficult, and the electrical short problem due to overflow of the solder bumps 10 may occur.

On the other hand, as another method for joining the micro LED ML to the electrodes E of the substrate P, an anisotropic conductive film (ACF) may be used. Other inventions using the characteristics of the anisotropic conductive film (ACF) include U.S. Patent Application Publication No. 2011-0254029 and U.S. Pat. No. 9,698,134.

FIG. 2B is a view illustrating a state in which the flip-type micro LED ML is joined to the substrate P with an anisotropic conductive film 11 as one example.

The anisotropic conductive film 11 is a state in which a core C of a conductive material is composed of a plurality of particles covered by an insulating film. The anisotropic conductive film 11 may electrically connect the micro LED ML and the substrate P by the core as the insulating film is destroyed only in a portion where pressure or heat is applied.

In this case, the separation distance d' between the terminals S of the micro LED ML and the separation distance between micro LEDs MLs are very short, and thus the core where the insulating film is destroyed may affect adjacent micro LEDs. As a result, this may cause an electrical short problem.

Thus, when using the anisotropic conductive film 11, there is a limitation that the design has to be made so as not to affect luminous efficacy of the micro LED ML.

However, in manufacturing a pixel unit of an optoelectronic display, a technique using the anisotropic conductive film (ACF) requires separate equipment and a separate process for thermal compression. Additionally, depending on the geometric shape or physical pressing force of a pressurized object, a difference may occur in the degree of thermal compression for each micro LED, and thus there is a possibility that a difference may occur in the degree of electrical connection to each micro LED.

Furthermore, the above related art has a disadvantage in that the separation distance between the micro LEDs has to be designed so that a portion of the core where the insulating film is destroyed does not affect adjacent micro LEDs. Moreover, a geometric height difference may be generated at a boundary between a portion that is thermally compressed and a portion that is not thermally compressed. Thus there is a limitation in that this height difference has to be designed so that the anisotropic conductive film (ACF) does not affect luminous efficacy of the micro LEDs.

The foregoing is intended merely to aid in the understanding of the background of the present invention, and is not intended to mean that the present invention falls within the purview of the related art that is already known to those skilled in the art.

DOCUMENTS OF RELATED ART (Patent document 1) U.S. Patent Application Publication No. 2011-0254029
(Patent document 2) U.S. Pat. No. 9,698,134

SUMMARY OF THE INVENTION

Accordingly, the present invention has been made keeping in mind the above problems occurring in the related art, and an objective of the present invention is to provide an anodic oxide film for electric contact for capable of solving the problem of electrical connection between optical elements and electrical connection between terminals of the optical elements, to provide an optoelectronic display, and to provide a method of manufacturing the optoelectronic display.

In order to achieve the above objective, according to one aspect of the present invention, there is provided an anodic oxide film for electric contact, the anodic oxide film being provided between an optical element and a substrate to electrically connect a terminal of the optical element and an electrode of the substrate, the anodic oxide film including: a vertical conductive part penetrating the anodic oxide film; and a horizontal conductive part formed on a surface of the anodic oxide film and connected to the vertical conductive part, wherein the terminal of the optical element and the electrode of the substrate may be electrically connected to each other by the vertical conductive part and the horizontal conductive part.

Further, the vertical conductive part may include a protruding portion protruding from the surface of the anodic oxide film.

Further, the anodic oxide film may include a pore formed when anodizing a metal base material, and the vertical conductive part may be formed inside the pore.

Further, the anodic oxide film may include a through-hole formed to have a larger diameter than the pore formed when anodizing the metal base material, and the vertical conductive part may be formed inside the through-hole.

Further, the anodic oxide film may be provided as a plurality of layers.

Further, the vertical conductive part may include at least one of: a first metal part including at least one of Au, Ag, Cu, and Ni; and a second metal part made of a metal that can be melted at a temperature lower than a melting temperature of the first metal part.

Further, the second metal part may include an Sn-based solder.

Further, the second metal part may be formed on the first metal part, and the second metal part may protrude from the surface of the anodic oxide film.

According to another aspect of the present invention, there is provided an optoelectronic display, including: an optical element; a substrate; and an anodic oxide film for electric contact provided between the optical element and the substrate, wherein the anodic oxide film for electric contact may include a vertical conductive part penetrating the anodic oxide film and a horizontal conductive part formed on a surface of the anodic oxide film and connected to the vertical conductive part, and the anodic oxide film for electric contact may be configured to electrically connect a terminal of the optical element to an electrode of the substrate.

Further, the terminal of the optical element may be connected to a plurality of vertical conductive parts.

Further, a vertical projection area of the horizontal conductive part may be formed to overlap with a vertical projection area of the optical element, and the vertical projection area of the horizontal conductive part may be formed to overlap with a vertical projection area of the electrode of the substrate.

Further, the anodic oxide film for electric contact may be provided as a plurality of anodic oxide films, and the horizontal conductive part may be provided between anodic oxide films adjacent to each other from top to bottom.

The optoelectronic display may further include an insulating part formed to cover at least a part of an area except for a contact area where the vertical conductive part is exposed outside.

Further, the vertical conductive part may include an Sn-based solder.

Further, the optical element may be a micro LED.

According to still another aspect of the present invention, there is provided a method of manufacturing an optoelectronic display, the method including: providing a substrate; providing an anodic oxide film for electric contact having a vertical conductive part and a horizontal conductive part, on the substrate; and mounting an optical element on the anodic oxide film for electric contact.

Further, the mounting the optical element on the anodic oxide film for electric contact may include melting the vertical conductive part to electrically connect a terminal of the optical element and an electrode of the substrate and to simultaneously fix the optical element to the substrate.

As described above, the anodic oxide film for electric contact, the optoelectronic display, and the method of manufacturing the optoelectronic display according to the prevent invention can prevent an electrical short problem that may occur between optical elements having a small separation distance.

Further, the present invention has an effect of improving luminous efficacy of the optical element by providing an excellent heat dissipation effect.

BRIEF DESCRIPTION OF THE DRAWINGS

The above and other objectives, features, and other advantages of the present invention will be more clearly understood from the following detailed description when taken in conjunction with the accompanying drawings, in which:

FIGS. 6A and 6B are enlarged views illustrating a vertical conductive part;

FIGS. 7A and 7B are views schematically illustrating an anodic oxide film for electric contact having an insulating part;

FIGS. 8A, 8B, and 8C are views illustrating a state in which micro LEDs of different sizes and the anodic oxide film for electric contact according to the present invention are joined; and FIG. 9 is a view illustrating an anodic oxide film for electric contact composed of a plurality of anodic oxide films.

DETAILED DESCRIPTION OF THE INVENTION

Figure 1A:
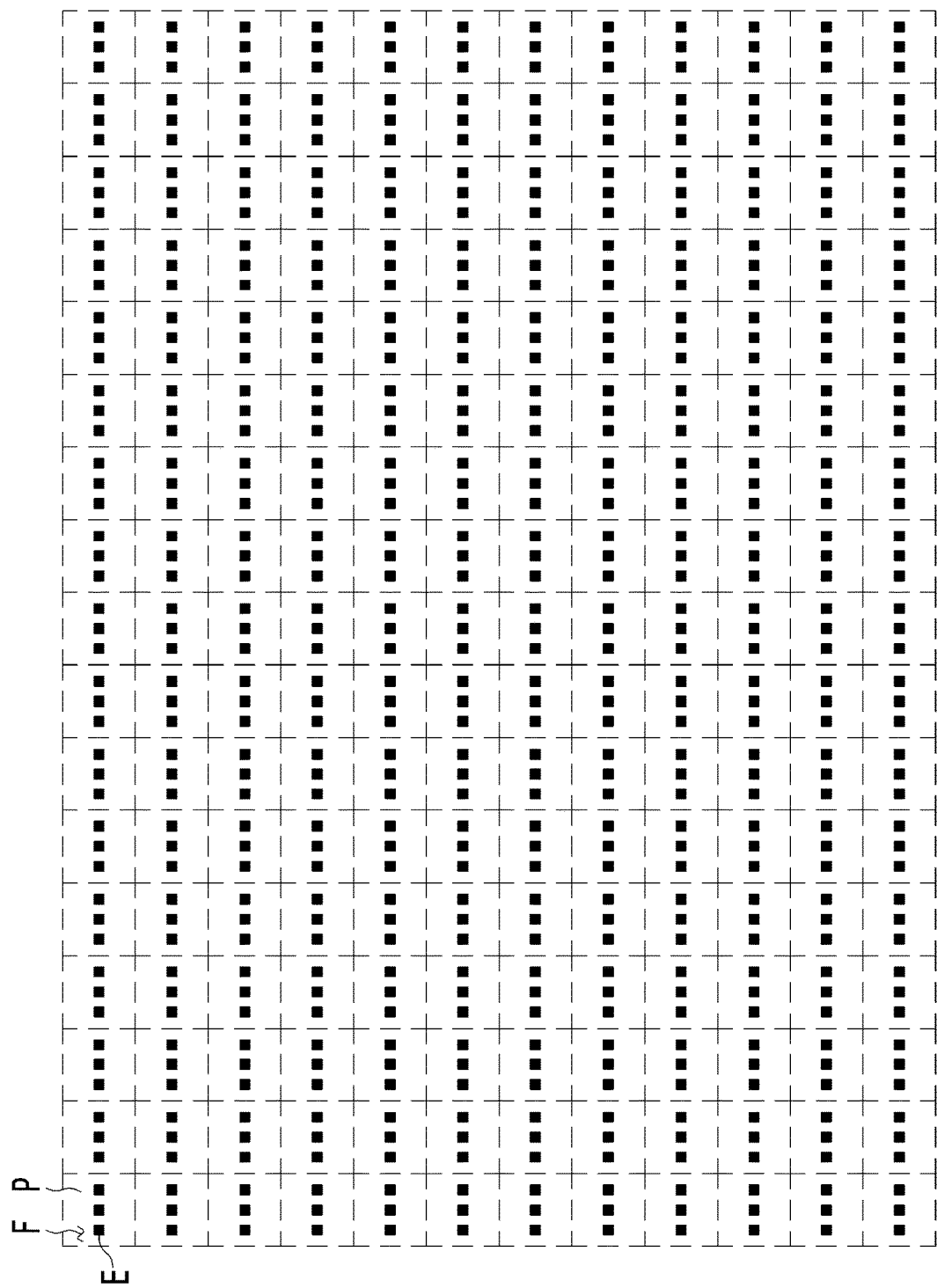
FIGS. 1A, 1B, 1C, 2A, and 2B are views schematically illustrating a technology underlying the present invention.
Figure 1B:
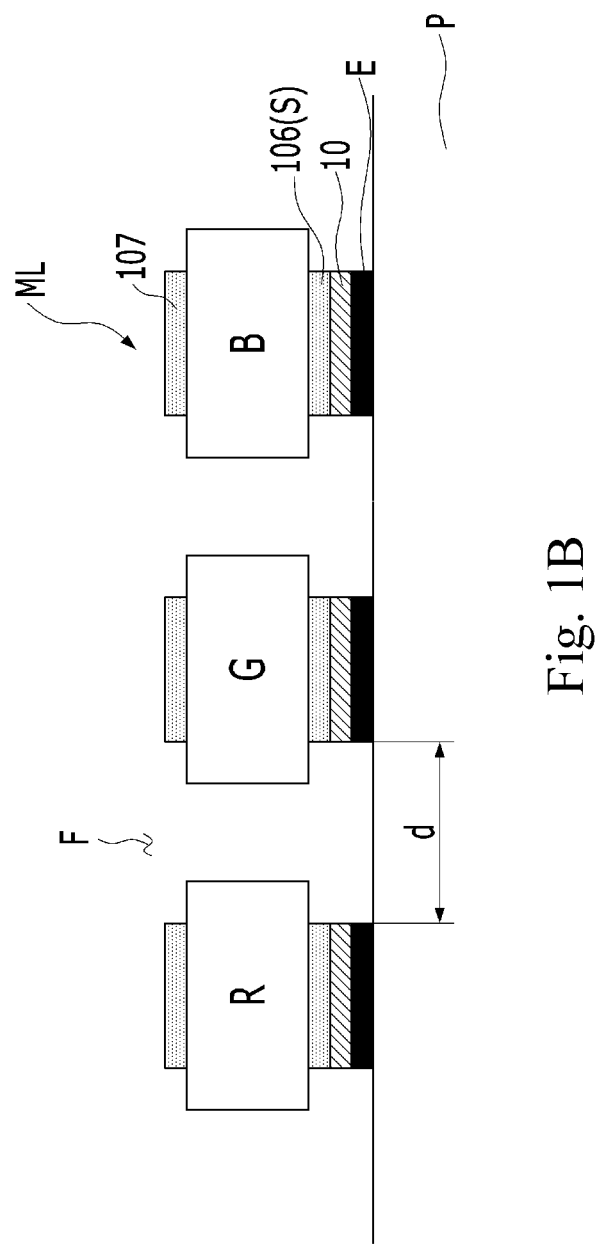
Figure 1C:
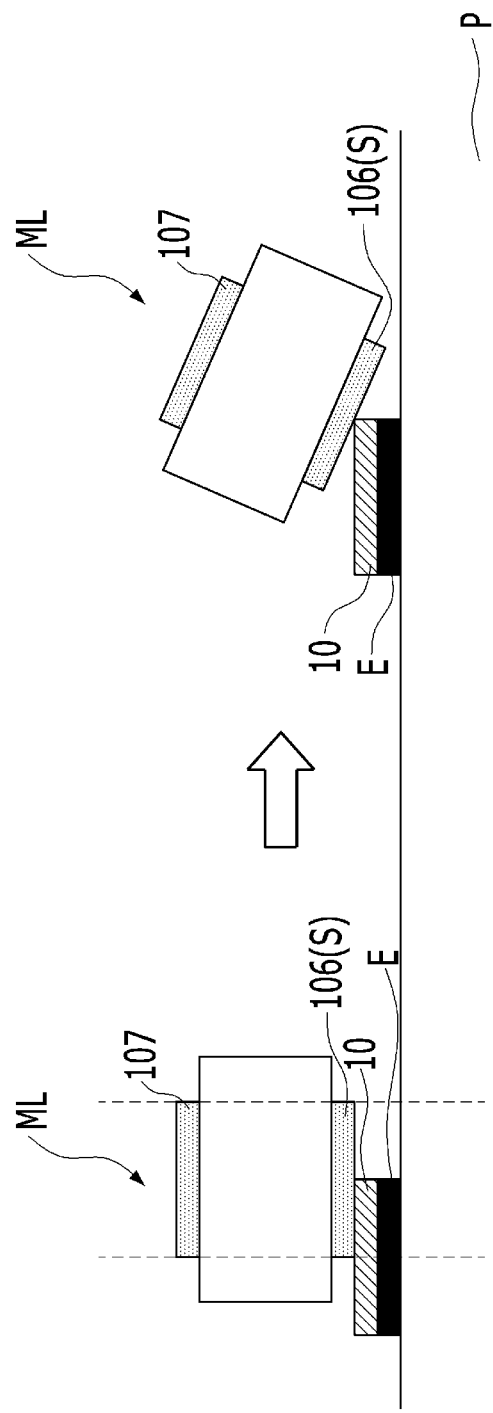
Figure 2A:
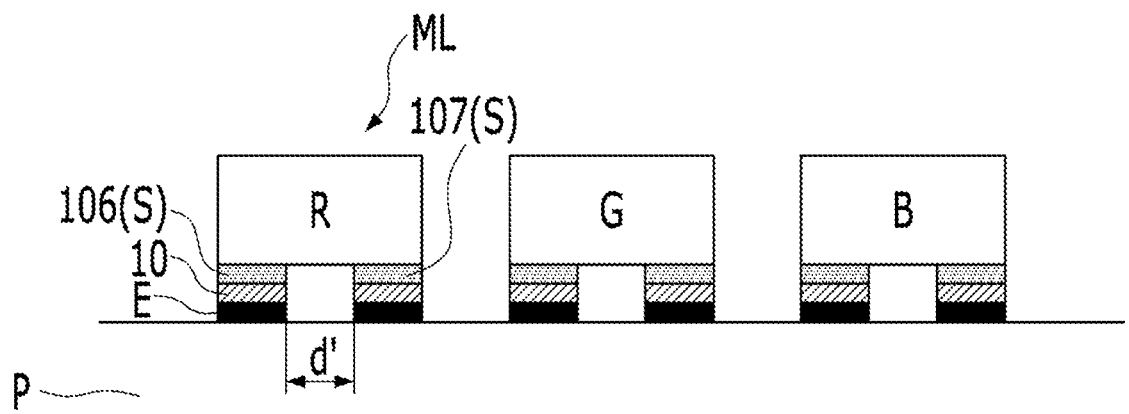
Figure 2B:
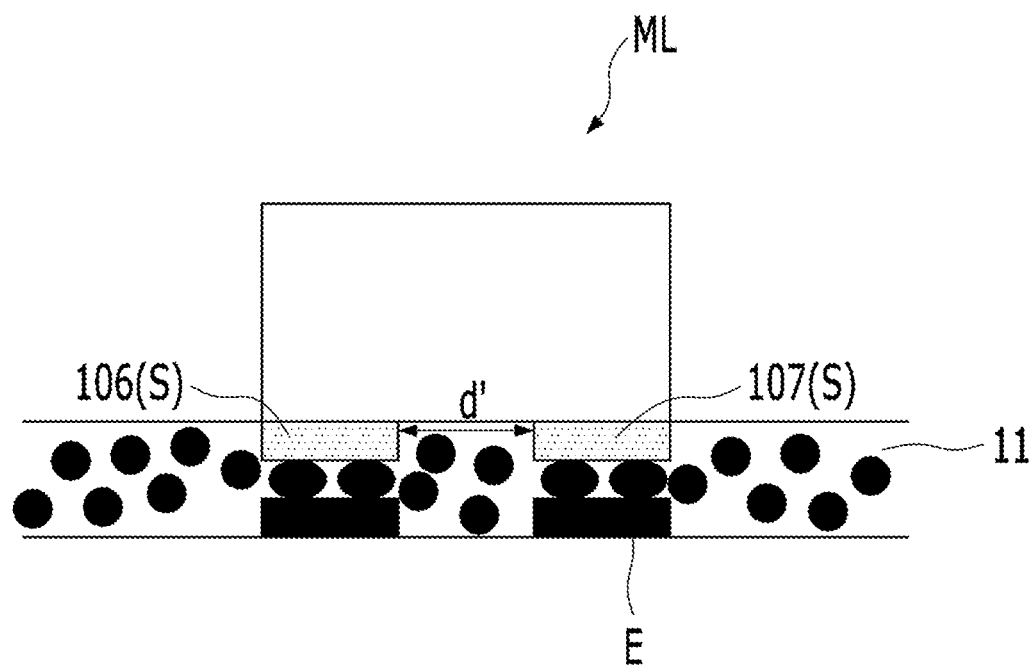

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to the specifically-listed embodiments and the conditions.

The above described objectives, features, and advantages will be more apparent through the following detailed description related to the accompanying drawings, and thus those of ordinary skill in the art may easily implement the technical spirit of the invention.

The embodiments of the present invention will be described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, prior to describing exemplary embodiments of the present invention with reference to the accompanying drawings, an optical element may include a micro LED. The micro LED is not a package type covered with molded resin or the like but a piece obtained by cutting out a wafer used for crystal growth, and academically refers to one having a size of 1 to 100 μm. However, the micro LED described herein is not limited to one having a size (length of one side) of 1 to 100 μm, and includes one having a size of equal to or greater than 100 μm or a size of less than 1 μm.

Further, the configurations of the exemplary embodiments of the present invention described below can also be applied to a micro-device that can be applied without changing the technical spirit of each embodiment.

Hereinafter, a micro LED is exemplarily described as an optical element. Further, a 'terminal S' mentioned below may be classified depending on the types of micro LEDs is provided. In the case of a vertical-type micro LED, the terminal S may denote a first terminal 106 provided at the bottom. On the other hand, in the case of a flip-type micro LED, the terminal S may denote both first and second terminals 106 and 107 provided on any one side.

Figure 3:
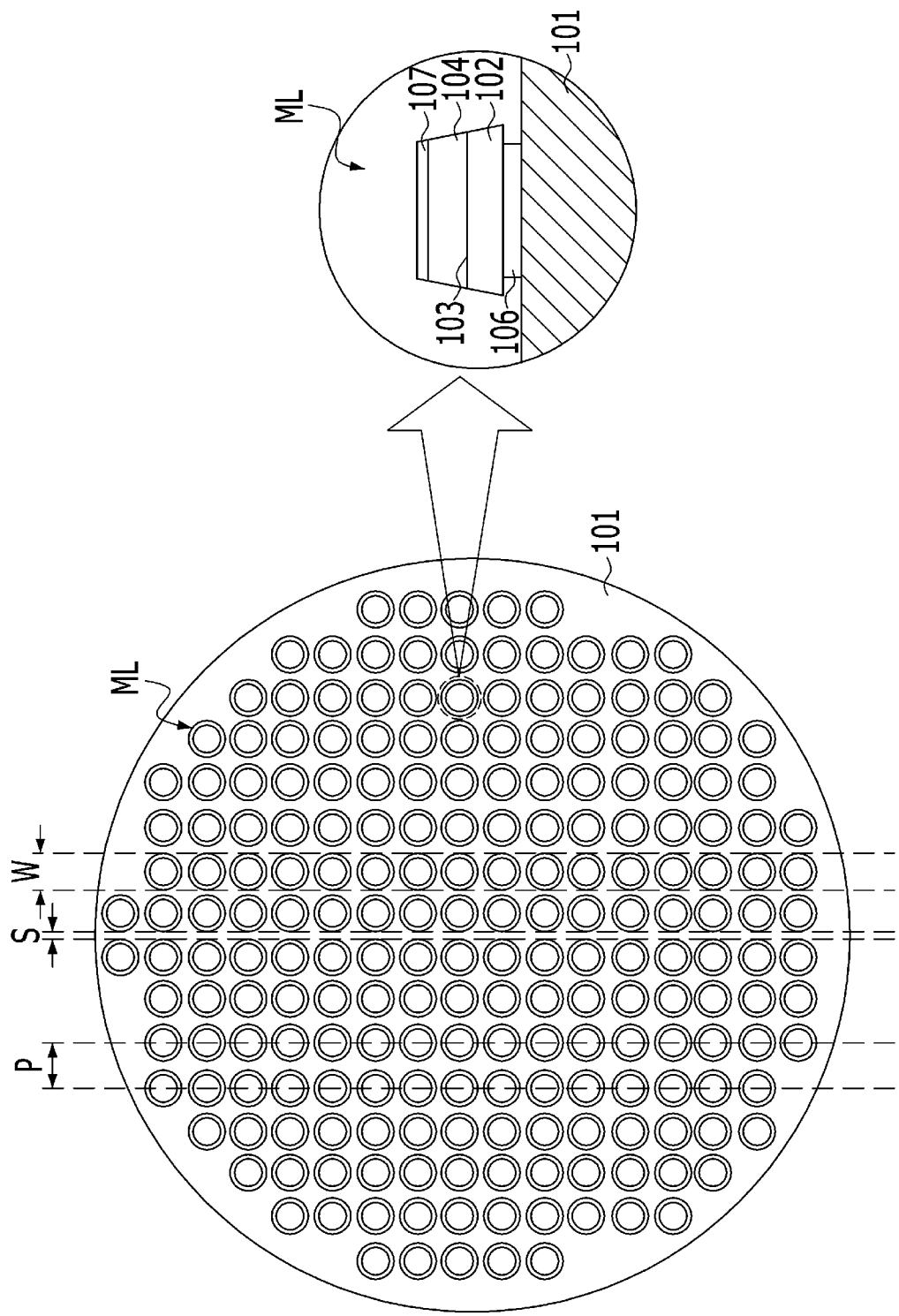
FIG. 3 is a view illustrating a micro LED that is to be mounted on a circuit board.

FIG. 3 is a view illustrating a plurality of micro LEDs that is to be mounted on a circuit board. The micro LEDs MLs are fabricated and disposed on a growth substrate 101.

The growth substrate 101 may be embodied by a conductive substrate or an insulating substrate. For example, the growth substrate 101 may be made of at least one selected from among the group consisting of sapphire, SiC, Si, GaAs, GaN, ZnO, GaP, InP, Ge, and $Ga_2O_3$.

Each of the micro LEDs MLs may include: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. The p-type semiconductor layer may be made of a semiconductor material having a composition formula of $In_xAl_yGa_{1-x-y}N$ ($0 \leq x \leq 1$, $0 \leq y \leq 1$, $0 \leq x+y \leq 1$) selected from among, for example, GaN, AlN, AlGaN, InGaN, InN, InAlGaN, AlInN, and the like, and the layer may be doped with a p-type dopant such as Mg, Zn, Ca, Sr, or Ba.

The second semiconductor layer 104 may be implemented, for example, as an n-type semiconductor layer. The n-type semiconductor layer may be made of a semiconductor material having a composition formula of $In_xAl_yGa_{1-x-y}N$ ($0 \leq x \leq 1$, $0 \leq y \leq 1$, $0 \leq x+y \leq 1$) selected from among, for example, GaN, AlN, AlGaN, InGaN, InN, InAlGaN, AlInN, and the like, and the layer may be doped with an n-type dopant such as Si, Ge, or Sn.

However, the present invention is not limited to this. The first semiconductor layer 102 may be implemented as an n-type semiconductor layer, and the second semiconductor layer 104 may be implemented as a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be made of a semiconductor material having a composition formula of $In_xAl_yGa_{1-x-y}N$ ($0 \le x \le 1$, $0 \le x+y \le 1$) and may have a single quantum well structure or a multi quantum well (MQW) structure. Additionally, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include at least one layer and may be made of various conductive materials including a metal, conductive oxide, and conductive polymer.

The plurality of micro LEDs MLs formed on the growth substrate 101 are separated into individual pieces by cutting along a cutting line using a laser or the like or by etching. Then, it is possible to separate the individual micro LEDs MLs from the growth substrate 101 by a laser lift-off process.

In FIG. 3, the letter 'P' denotes a pitch distance between the micro LEDs MLs, 'S' denotes a separation distance between the micro LEDs MLs, and 'W' denotes a width of each micro LED ML. FIG. 3 exemplarily illustrates that the cross-sectional shape of the micro LED ML is circular, but the cross-sectional shape of the micro LED ML is not limited to this. For example, the micro LED ML may have a cross-sectional shape other than the circular cross-section, such as a square cross-section, according to a method of fabricating the micro LED ML on the growth substrate 101.

Figure 4:
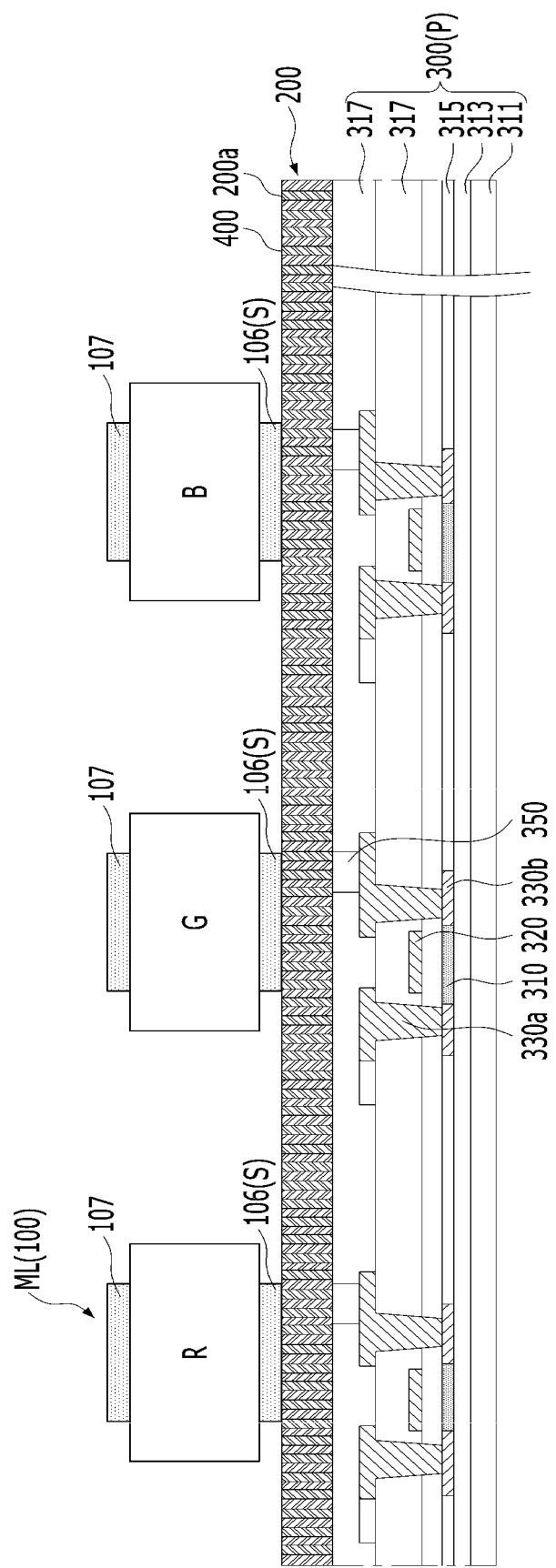
FIG. 4 is an enlarged view illustrating a pixel unit of an optoelectronic display according to the present invention.

FIG. 4 is an enlarged view illustrating a pixel unit of an optoelectronic display according to the present invention. In the present invention, a micro LED ML is illustrated as one example of an optical element 100. The pixel unit of the optoelectronic display may include optical elements 100 of red R, green G, and blue B.

Each of the optical elements 100 may have a terminal S electrically connected to an electrode 330b of a substrate P. Hereinafter, a circuit board 300 will be illustrated as one example of the substrate P on which the optical elements 100 are mounted, and the circuit board 300 for driving micro LEDs MLs will be described with reference to FIG. 4.

The circuit board 300 that drives micro LEDs MLs may be made of various materials. For example, the circuit board 300 may be made of a transparent glass material having $SiO_2$ as a main component. However, materials of the circuit board 300 are not limited to this. For example, the circuit board 300 may be made of a transparent plastic material and have solubility. The plastic material may be an organic substance selected from among the group consisting of organic insulating substances, including polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the circuit board 300, the circuit board 300 is required to be made of a transparent material. However, in the case of a top emission type in which an image is implemented in a direction opposite to the circuit board 300, the circuit board 300 is not required to be made of a transparent material. In this case, the circuit board 300 may be made of metal.

In the case of forming the circuit board 300 using metal, the circuit board 300 may be made of at least one metal selected from among the group consisting of iron, chromium, manganese, nickel, titanium, molybdenum, stainless steel (SUS), Invar alloy, Inconel alloy, and Kovar alloy, but is not limited thereto.

The circuit board 300 may include a buffer layer 311. The buffer layer 311 may provide a flat surface and block foreign matter or moisture from penetrating therethrough. For example, the buffer layer 311 may contain an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed as a multi-laminate of the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs including the bottom gate type may be employed.

The active layer 310 may contain a semiconductor material, such as amorphous silicon or polycrystalline silicon. However, the present embodiment is not limited thereto, and the active layer 310 may contain various materials. As an alternative embodiment, the active layer 310 may contain an organic semiconductor material or the like.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate insulating layer 313 is formed on the active layer 310. The gate insulating layer 313 serves to electrically isolate the active layer 310 and the gate electrode 320. The gate insulating layer 313 may be formed as a multilayer or a single layer of a film made of an inorganic substance such as silicon oxide and/or silicon nitride.

The gate electrode 320 is provided on the gate insulating layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be laminated, and processability, the gate electrode 320 may be formed as a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer insulating film 315 is provided on the gate electrode 320. The interlayer insulating film 315 electrically isolates the source electrode 330a, the drain electrode 330b, and the gate electrode 320. The interlayer insulating film 315 may be formed as a multilayer or single layer of a film made of an inorganic substance. For example, the inorganic substance may be a metal oxide or a metal nitride. In detail, the inorganic substance may include silicon dioxide ($SiO_2$), silicon nitride (SiNx), silicon oxynitride (SiON), aluminum oxide (Al$_2$O$_3$), titanium dioxide (TiO$_2$), tantalum pentoxide (Ta$_2$O$_5$), hafnium dioxide (HfO$_2$), or zirconium dioxide (ZrO$_2$).

The source electrode 330a and the drain electrode 330b are provided on the interlayer insulating film 315. The source electrode 330a and the drain electrode 330b may be formed as a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is formed on the TFT. The planarization layer 317 is configured to cover the TFT, thereby eliminating a height difference caused by the TFT and planarizing a top surface. The planarization layer 317 may be formed as a single layer or a multilayer of a film made of an organic substance. The organic substance may include a general-purpose polymer such as polymethyl methacrylate (PMMA) and polystyrene (PS); a polymer derivative having a phenol group; an acryl-based polymer, an imide-based polymer, an arylether-based polymer, an amide-based polymer, a fluorine-based polymer, a p-xylene-based polymer, a vinyl alcohol-based polymer; and a blend thereof. In addition, the planarization layer 317 may be formed as a multi-laminate of an inorganic insulating layer and an organic insulating layer.

An anodic oxide film 200 for electric contact is provided on the circuit board 300 configured as described above.

As illustrated in FIG. 4, the anodic oxide film 200 for electric contact may be provided between the optical elements 100 and the substrate P to electrically connect the terminal S of the optical element 100 and the electrode 330b of the substrate P. The anodic oxide film 200 for electric contact may include a vertical conductive part 200a penetrating an anodic oxide film 400 and a horizontal conductive part 200b formed on the surface of the anodic oxide film 400 and connected to the vertical conductive part 200a, so that the terminal S of the optical element 100 and the electrode 330b of the substrate P may be connected to each other by the vertical conductive part 200a and the horizontal conductive part 200b.

First, the anodic oxide film 400 constituting the anodic oxide film 200 for electric contact denotes a film formed by anodizing a metal as a base material, and pores 400a denote holes formed in the process of forming the anodic oxide film 400 by anodizing the metal. For example, in a case that the metal as the base material is aluminum (Al) or an aluminum alloy, the anodization of the base material forms an anodic oxide film consisting of anodized aluminum (Al$_2$O$_3$) on the surface of the base material. The anodic oxide film 400 formed as described above includes a barrier layer in which the pores 400a are not formed and a porous layer in which the pores 400a are formed. The barrier layer is located on the base material, and the porous layer is located on the barrier layer. When removing the base material on which the anodic oxide film 400 including the barrier layer and the porous layer is formed, only the anodic oxide film 400 consisting of anodized aluminum (Al$_2$O$_3$) remains. Further, when removing the barrier layer in this state, the anodic oxide film 400 has a plurality of pores 400a having a uniform diameter, formed in a vertical shape penetrating from top to bottom, and having a regular arrangement. An internal width of the pores 400a has a size of several nanometers to several hundred nanometers.

As such, the anodic oxide film 400 has the pores 400a formed when anodizing the metal base material, and the vertical conductive part 200a may be formed inside the pores 400a.

Each of the pores 400a exists independently of other pores, and thus when the vertical conductive part 200a is formed inside each of the pores 400a, the respective vertical conductive parts 200a are not connected to each other but exist independently of each other. In other words, since the pores 400a of the anodic oxide film 400 exist in a spaced apart relationship with respect to each other in a vertical shape, the vertical conductive parts 200a formed in the pores 400a also exist in a spaced apart relationship with respect to each other in a vertical shape.

The vertical conductive part 200a may be formed by a conductive material. For example, the conductive material may include at least one of Ag, Au, and Cu having high electrical conductivity properties. Further, the vertical conductive part 200a may include an Sn based-solder having a low melting point. As the Sn based-solder, an Sn or Sn alloy, for example, Sn, AuSn, SnAgCu, SnBi, SnPb, SnPbAg, SnSb, SnCu, SnAg, or the like may be used, and these materials may be used in various composition ratios. However, the conductive material forming the vertical conductive part 200a is not limited to the above-described configuration, and the material is not limited as long as a material having conductivity and or a material having a low melting point.

As illustrated in FIG. 4, the vertical conductive part 200a may be foiled in each of the pores 400a of the anodic oxide film 200 for electric contact. The anodic oxide film 200 for electric contact may be divided into an area where the micro LEDs MLs are mounted and an area where the micro LEDs MLs are not mounted. In this case, as illustrated in FIG. 4, the respective vertical conductive parts 200a may be formed in all of the pores 400a including the area where the micro LEDs MLs are not mounted.

Since the vertical conductive parts 200a are formed in the pores 400a of the area where the micro LEDs MLs are mounted, the area where the micro LEDs MLs are mounted may have conductivity in the vertical direction through the vertical conductive parts 200a. At the same time, heat generated from the micro LEDs MLs may be effectively dissipated in the vertical direction through the vertical conductive parts 200a.

Due to the configuration of the anodic oxide film 200 for electric contact having material properties of an anodic oxide film, heat generated in the micro LEDs MLs may be effectively dissipated in the vertical direction and heat generated from the micro LEDs MLs may be effectively blocked from being transmitted in the horizontal direction inside the anodic oxide film 200 for electric contact. As a result, it is possible to prevent luminous efficacy of the micro LEDs MLs from being deteriorated by minimizing the effect of heat generated from the micro LEDs MLs on other adjacent micro LEDs MLs.

The micro LEDs MLs may be provided on the anodic oxide film 200 for electric contact as described above. In this case, the micro LEDs MLs may be joined to the top of the anodic oxide film 200 for electric contact by the vertical conductive parts 200a. Since the vertical conductive parts 200a are made of a metal having a characteristic of high electrical conductivity or having a low melting point, the micro LEDs MLs may be easily joined and fixed to the top of the anodic oxide film 200 for electric contact. Thus, even if separate joining layers (e.g., solder bumps) for joining the micro LEDs MLs are not provided, the micro LEDs MLs may be joined to the top of the anodic oxide film 200 for electric contact.

Further, since the vertical conductive parts 200a have a structure formed in all of the pores 400a of the anodic oxide film 200 for electric contact, there is an advantage that a precise alignment technique does not need to be considered when mounting the micro LEDs MLs.

Conventionally, due to the small size of the micro LEDs MLs, a very precise alignment technique has been required to join the micro LEDs MLs to electrodes of a substrate. However, it is difficult to precisely align the micro LEDs MLs of a very small size due to mechanical errors of a transfer means for micro LED transfer, and thus there is a high probability of misalignment. As a result, this causes a problem that the micro LEDs MLs may be tilted.

Further, due to the small size of the micro LEDs MLs, the micro LEDs MLs may be formed to have a short separation distance d between the micro LEDs MLs and a short separation distance d' between terminals of the micro LEDs MLs. This may cause an electrical short to occur due to overflow of the solder bumps provided as joining layers. Additionally, a core where an insulating film of an anisotropic conductive film provided as a joining layer is destroyed may affect adjacent micro LEDs and terminals thereof, causing an electrical short.

However, in the anodic oxide film 200 for electric contact according to the present invention, even if the micro LEDs MLs are mounted by an alignment technique having a relatively low precision, misalignment may not occur due to the structure in which the vertical conductive parts 200a are formed in all of the pores 400a, thereby preventing a micro LED tilting problem.

Additionally, since the structure of the anodic oxide film 200 for electric contact has no conductivity in the horizontal direction therein, an electrical short problem that may be caused due to the short separation distance d between the micro LEDs MLs and the short separation distance d' between the terminals S of the micro LEDs MLs may be prevented.

The vertical conductive parts 200a in the area where the micro LEDs MLs are mounted are electrically connected to respective drain electrodes 330b, which are electrodes of the substrate, via respective contact holes 350. This may enable electrical connection between the micro LEDs MLs and the circuit board 300.

Meanwhile, the horizontal conductive part 200b connected to the vertical conductive parts 200a may be provided on the surface of the anodic oxide film 400. In the case of the horizontal conductive part 200b, the material thereof is not limited as long as a material having conductivity, the configuration thereof may be the same as that of the vertical conductive parts 200a. The horizontal conductive part 200b may be formed, as one example, by patterning in an island shape. The horizontal conductive part 200b may function to electrically connect the drain electrode 330b of the circuit board 300 and the anodic oxide film 200 for electric contact more effectively.

In FIG. 4, as one example, it is illustrated that vertical-type micro LEDs MLs are provided on the anodic oxide film 200 for electric contact, each of the vertical-type micro LEDs MLs being provided with a p-n diode, and a terminal S including a first contact electrode 106 disposed on one side of the p-n diode and a second contact electrode 107 located on the opposite side to the first contact electrode 106. As another example, the micro LEDs MLs may be flip-type micro LEDs MLs each of which has a terminal S provided on any one of top and bottom surfaces thereof.

A top electrode (not illustrated) may be provided on the each of the micro LEDs MLs. The top electrode is electrically connected to the second contact electrode 107 of the micro LED ML. The top electrode 530 may be made of a transparent conductive material such as ITO, IZO, ZnO, $In_2O_3$, or the like.

FIGS. 5A, 5B, 5C, 5D-1, and 5D-2 are views schematically illustrating a method of manufacturing an anodic oxide film 200 for electric contact according to the present invention. Hereinafter, an electrode E of a substrate P is schematically illustrated. When the substrate P is a circuit board 300, the electrode E may be a drain electrode 330b.

Figure 5A:
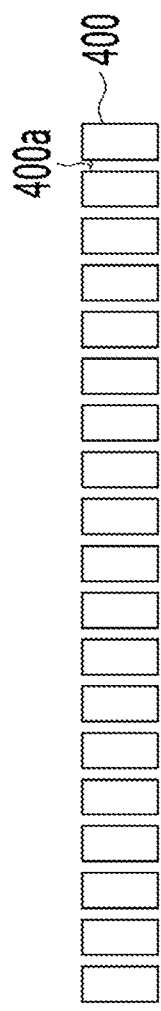
FIGS. 5A, 5B, 5C, 5D-1, and 5D-2 are views schematically illustrating a method of manufacturing an anodic oxide film for electric contact according to the present invention.

First, as illustrated in FIG. 5A, an anodic film 400 in which pores 400a penetrating from top to bottom are formed may be provided by removing a metal base material of an anodic oxide film prepared by anodizing the metal and then removing a barrier layer.

Figure 5B:
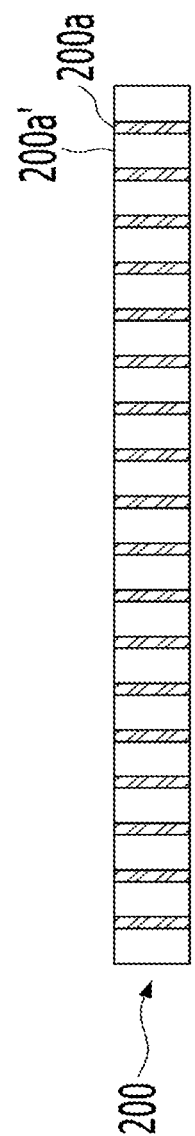

Then, as illustrated in FIG. 5B, a process of filling pores 400a of the anodic oxide film 400 with a conductive material may be performed. Here, as a method of filling the pore 400a with the conductive material, atomic layer deposition (ALD) may be used. However, as the filling method, any method other than the atomic layer deposition (ALD) may be possible as long as it is a method of capable of filling the pores 400a with the conductive material. As a result, vertical conductive parts 200a are formed inside the pores 400a. Due to the formation of the vertical conductive parts 200a inside the pores 400a of the anodic oxide film 400, an anodic oxide film 200 for electric contact is formed.

In the case of the anodic oxide film 200 for electric contact, as illustrated in FIG. 5B, the vertical conductive parts 200a inside the pores 400a may be provided in a shape not protruding further than the surface of the anodic oxide film 400. In other words, each of the vertical conductive parts 200a may be provided in a shape that does not include a protruding portion 203 protruding from the surface of the anodic oxide film 400.

Figure 5C:
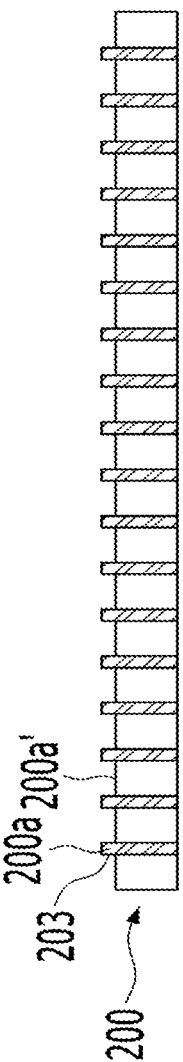

Alternatively, as illustrated in FIG. 5C, vertical conductive parts 200a each of which includes the protruding portion 203 protruding from the surface of the anodic oxide film 400 may be formed. In the case of the anodic oxide film 200 for electric contact, a process of planarizing the surface of the anodic oxide film 400 before forming the protruding portion 203 as illustrated in FIG. 5C may be selectively performed.

Then, the respective protruding portions 203 may be formed as illustrated in FIG. 5C. The protruding portions 203 may be formed by etching at least a portion of each of vertical conductive part non-forming areas 200a' in which the vertical conductive parts 200a are not formed, in the depth direction of the anodic oxide film 400.

In this case, the micro LEDs MLs may be joined to the top of the anodic oxide film 200 for electric contact by melting the protruding portions 203. The protruding portions 203 have electrical conductivity properties as a configuration of the vertical conductive parts 200a, and thus the micro LEDs MLs joined by the protruding portions 203 may be electrically connected to the circuit board 300 via the anodic oxide film 200 for electric contact.

Preferably, the protruding length of the protruding portions 203 is formed to a length that does not affect adjacent micro LEDs MLs and terminals of the micro LEDs MLs when the micro LEDs MLs are joined to the protruding portions 203.

Figures 1, 5D:
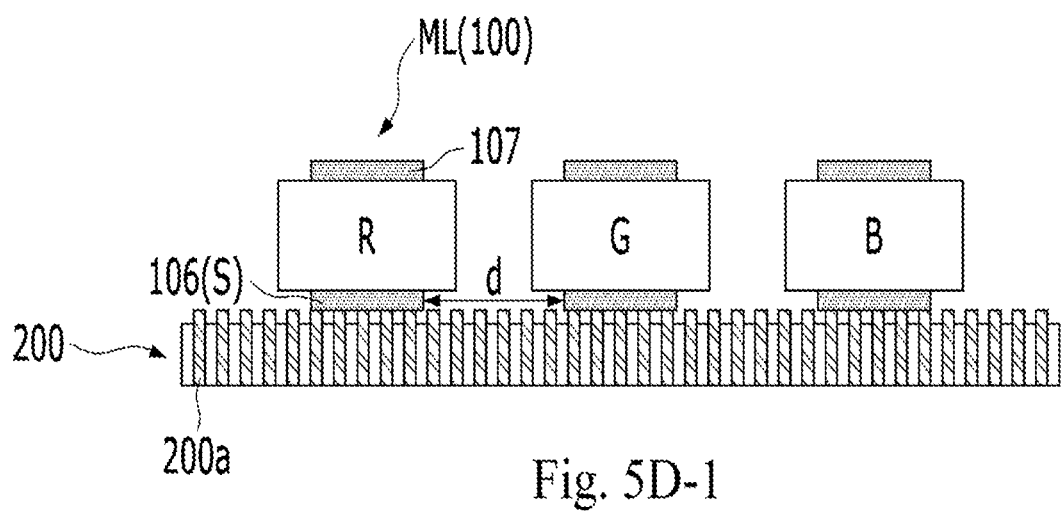

In detail, as illustrated in FIG. 5D-1, in the case of the vertical-type micro LEDs MLs, a separation distance d between the micro LEDs MLs is defined by the distance between respective first contact electrodes 106, which are bottom terminals of the micro LEDs MLs. In this case, preferably, the protruding length of the protruding portions 203 is formed smaller than $$\frac{d}{2}.$$

Figures 2, 5D:
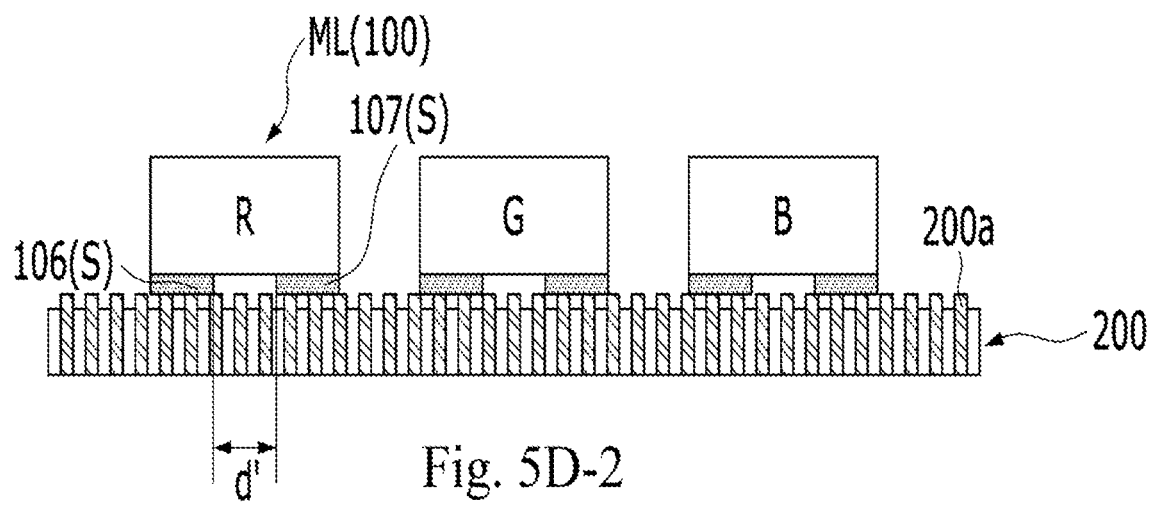

Further, as illustrated in FIG. 5D-2, in the case of the flip-type micro LEDs MLs, terminals e.g. first and second contact electrodes 106 and 107 are all provided on a bottom surface of each of the micro LEDs MLs and a separation distance d' is formed between the terminals. In this case, preferably, the protruding length of the protruding portions 203 is formed smaller than $$\frac{d'}{2}.$$

As described above, the protruding length of the protruding portions 203 may be formed in consideration of the distance between adjacent micro LEDs MLs and between terminals when joining the micro LEDs MLs, thereby making it possible to prevent an electric short problem that may be caused due to melting of the protruding portions 203.

The vertical conductive parts 200a illustrated in each of FIGS. 5B and 5C are illustrated enlarged to specifically describe the process of forming the vertical conductive parts 200a. Thus, a separation distance between the vertical conductive parts 200a may be substantially shorter than separation distances illustrated in FIGS. 5D-1 and 5D-2.

On the other hand, the vertical conductive parts 200a of the anodic oxide film 200 for electric contact may be formed by filling with the conductive material, and each of the vertical conductive parts 200a may be composed of a first metal part 201 and a second metal part 202. This will be described in detail with reference to FIGS. 6A and 6B. FIGS. 6A and 6B are enlarged view illustrating the vertical conductive part 200a composed of the first and second metal parts 201 and 202.

The vertical conductive part 200a may include at least one of the first metal part 201 made of at least one of Au, Ag, Cu, and Ni, and the second metal part 202 made of a metal that can be melted at a temperature bottom than the melting temperature of the first metal part 201. Thus, the conductive material forming the above-described vertical conductive part 200a may include at least one of the first and second metal parts 201 and 202.

The vertical conductive part 200a may be composed of at least one of the first and second metal parts 201 and 202, or may be composed of both the first and second metal parts 201 and 202. In FIGS. 6A and 6B, the vertical conductive part 200a is illustrated and described as being composed of the first and second metal parts 201 and 202.

When the vertical conductive part 200a is composed of the first and second metal parts 201 and 202, the first metal part 201 is preferably made of a material having high electrical conductivity properties (e.g., Au, Ag, Cu, or Ni) and provided inside the pore 400a. The second metal part 202 is made of a metal that can be melted at a temperature bottom than the melting temperature of the first metal part 201 to perform a function of facilitating joining of a micro LED ML on the anodic oxide film 200 for electric contact, and thus the second metal part 202 is preferably provided on the first metal part 201 in a shape protruding from a top surface of the anodic oxide film 400.

The second metal part 202 may include an Sn-based solder. In detail, as the Sn based-solder, an Sn or Sn alloy, for example, Sn, AuSn, SnAgCu, SnBi, SnPb, SnPbAg, SnSb, SnCu, SnAg, or the like may be used, and these materials may be used in various composition ratios.

As described above with reference to FIG. 5C, each of the vertical conductive parts 200a may include the protruding portion 203. In this case, as illustrated in FIG. 6A, the respective protruding portions 203 may be formed by etching at least a portion of each of pore non-forming areas around the respective first metal parts 201 in a depth direction. Alternatively, the protruding portions 203 may be formed by forming the respective second metal parts 202 on first metal parts 201 that are formed in a shape not protruding from the surface of the anodic oxide film 400. However, regardless of the shape of the first metal parts 201 protruding from the surface of the anodic oxide film 400, the second metal parts 202 formed on the first metal parts 201 protrude from the surface of the anodic oxide film 400. Thus, when each of the vertical conductive parts 200a is composed of the first and second metal parts 201 and 202, the anodic oxide film 200 for electric contact may be formed in a shape in which the protruding portions 203 are formed by the second metal parts 202.

The second metal parts 202 each of which includes the Sn-based solder described above may help effectively achieve joining of the micro LED ML mounted on the anodic oxide film 200 for electric contact.

The case in which the vertical conductive part 200a is composed of the first and second metal parts 201 and 202 is only a selective embodiment. Thus, hereinafter, the vertical conductive part 200a will be illustrated and described as having a structure that is formed by filling with the conductive material having a high electrical conductivity and having a low melting point.

Meanwhile, the anodic oxide film 200 for electric contact may be formed in a shape in which a separate through-hole is formed to form the vertical conductive part 200a inside the through-hole.

Referring to FIG. 5A again, the through-hole may be formed to have a diameter larger than the diameter of each of the pores 400a formed when anodizing the metal base material on the anodic oxide film 400 formed with the pores 400a penetrating from top to bottom. However, in this case, the anodic oxide film 400 may be provided without removing the barrier layer.

A plurality of through-holes may be formed to penetrate top and bottom surfaces of the anodic oxide film 400. In this case, the through-holes may be formed by etching. A plurality of pores 400a may be positioned between adjacent through-holes, and a separation distance between adjacent pores 400a is formed smaller than a separation distance between the adjacent through-holes.

A conductive material may then be filled in the through-holes to form vertical conductive parts 200a. In this case, a method of filling with the conductive material may be the same as the above-described method of filling the pores 400a with the conductive material, and the present invention is not limited thereto.

When the through-holes are formed to provide the vertical conductive parts 200a as described above, this is more advantageous in terms of heat dissipation than the structure of forming the vertical conductive parts 200a in all of the pores 400a. Additionally, provision of a separate joining layer (e.g., a solder bump) is not necessary, and thus there is an advantage of preventing the electric short problem due to overflow of the solder bump.

After the anodic oxide film 200 for electric contact is manufactured through the above manufacturing process, the micro LEDs MLs may be mounted on the top of the anodic oxide film 200 for electric contact and then the anodic oxide film 200 for electric contact may be positioned on the top of the circuit board 300. Alternatively, the anodic oxide film 200 for electric contact may be provided first on the top of the circuit board 300 and then the micro LEDs MLs may be transferred.

Referring to FIG. 4 again, the optoelectronic display including the anodic oxide film 200 for electric contact manufactured as described above may include the optical elements 100 and the substrate P and may have a structure in which the anodic oxide film 200 for electric contact is provided between the optical elements 100 and the substrate P. In this case, since the anodic oxide film 200 for electric contact includes the vertical conductive parts 200a penetrating the anodic oxide film 400 and the horizontal conductive part 200b formed on the surface of the anodic oxide film 400 and connected to the vertical conductive parts 200a, the terminal S of each of the optical elements 100 and the electrode 330b of the substrate P may be electrically connected to each other.

Due to the structure in which the vertical conductive parts 200a are formed in all of the pores 400a of the anodic oxide film 200 for electric contact, the optoelectronic display including the anodic oxide film 200 for electric contact may have, as illustrated in FIG. 4, a shape in which the terminal S of the optical element 100 is connected to a plurality of vertical conductive parts 200a. The vertical conductive parts 200a are provided inside the pores 400a that are formed at a very short separation distance in the anodic oxide film 400 and thus may have a substantially dot-like shape. Thus, when the shape in which the terminal S of the optical element 100 is connected to the plurality of vertical conductive parts 200a is viewed from below, the plurality of vertical conductive parts 200a are provided on a bottom surface of the terminal S of the optical element 100 in a shape of dots.

FIGS. 7A and 7B are views schematically illustrating a shape in which optical elements 100 are mounted on an anodic oxide film 200 for electric contact having an insulating part.

As illustrated in FIG. 7A, when the anodic oxide film 200 for electric contact is provided in a continuous shape, an insulating part 12 may be formed to cover at least a part of an area except for contact areas where vertical conductive parts 200a are exposed outside. Here, the contact areas denote areas where micro LEDs MLs are joined and connected to a top surface of the vertical conductive parts 200a.

In FIG. 7A, the insulating part 12 is illustrated as being not formed in areas where the vertical conductive parts 200a are exposed outside, the areas existing within the separation distance d between micro LEDs MLs. However, unlike this, the insulating part 12 may be formed in the entire area except for the areas where the micro LEDs MLs are joined. In this case, the insulating part 12 may be formed by patterning in an island shape in at least a part of the areas where the vertical conductive parts 200a are exposed outside, except for the areas where the micro LEDs MLs are joined.

As illustrated in FIG. 7B, the anodic oxide film 200 for electric contact may be cut and provided in a discontinuous shape. In this case, the anodic oxide film 200 for electric contact may be provided in a recess formed by a bank layer 4. In this structure, an insulating part 12' may be formed in a shape of a protective film such as a passivation layer. In this case, the insulating part 12' may be provided in a shape of a passivation layer including both the areas where the micro LEDs MLs of the anodic oxide film 200 for electric contact are joined and the areas where the vertical conductive parts 200a are exposed outside.

Figure 8C:
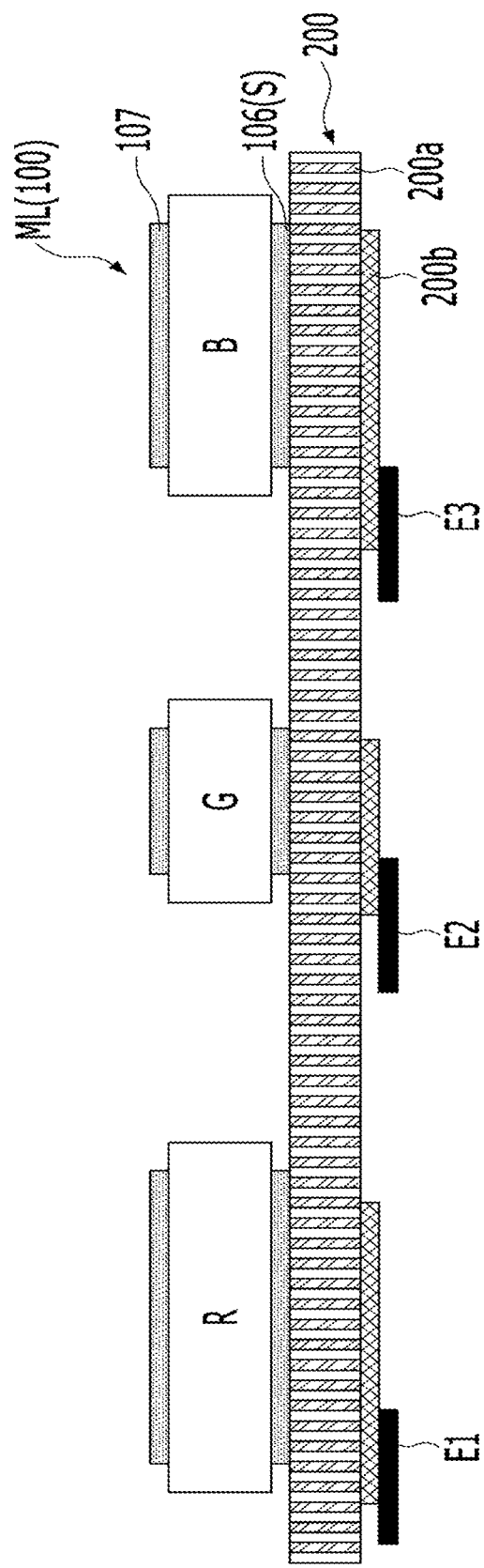

FIGS. 8A, 8B, and 8C are views illustrating a shape in which micro LEDs MLs of different sizes are mounted on the anodic oxide film 200 for electric contact.

Micro LEDs of different emission colors R, G, and B constituting the pixel unit in the optoelectronic display may be provided in different sizes. Due thereto, each electrode E of the substrate P corresponding to a terminal S of each of the micro LEDs MLs may be disposed in a position offset from the position of the terminal S of the micro LED ML.

In this case, due to the horizontal conductive part 200b provided on the surface of the anodic oxide film 400 and connected to the vertical conductive parts 200a, the anodic oxide film 200 for electric contact may effectively electrically connect the circuit board 300 and the micro LEDs MLs while avoiding the influence of the micro LEDs MLs of different sizes. This may be achieved by the formation position of the horizontal conductive part 200b.

Since the horizontal conductive part 200b is provided on the surface of the anodic oxide film 400, the formation position thereof may be any one of the top and bottom surfaces of the anodic oxide film 400. In FIGS. 8A, 8B, and 8C, as one example, horizontal conductive parts 200b are illustrated and described as being provided on the bottom surface of the anodic oxide film 400.

As illustrated in FIGS. 8A, 8B, and 8C, a vertical projection area of each of the horizontal conductive parts 200b may be formed to overlap with a vertical projection area of each optical element 100 and overlap with a vertical projection area of each electrode E of the substrate P. Here, the vertical projection area of each component denotes an area in which each component projects the anodic oxide film 400 in the vertical direction with respect to the anodic oxide film 400 of the anodic oxide film 200 for electric contact.

Hereinafter, embodiments in which the substrate P and optical elements 100 is electrically connected to each other by the anodic oxide film 200 for electric contact when the micro LEDs MLs of different emission colors are provided in different sizes will be described with reference to FIGS. 8A to 8C. In this case, in FIGS. 8A, 8B, and 8C, as one example, the optical elements 100 are illustrated as being vertical-type micro LEDs MLs.

Further, in FIGS. 8A, 8B, and 8C, electrodes E1, E2, and E3 electrically connected to the respective terminals S of the micro LEDs MLs of different emission colors R, G, and B by the anodic oxide film 200 for electric contact are formed on the substrate P, in positions that are offset from the positions of the respective terminals S of the micro LEDs MLs. In this case, E1 may be an electrode E that is electrically connected to a micro LED ML of red R, and E2 and E3 may be electrodes E that are electrically connected to a micro LED ML of green G and a micro LED ML of blue B, respectively.

As one example, in FIG. 8A, the micro LED ML of blue B is provided in a larger size than the micro LEDs MLs of red R and green G. In this case, the formation position of the electrodes E of the substrate P and the formation position of the terminals of the micro LEDs MLs are positions that are offset from each other. Further, a separation distance between the micro LED ML of red R and the micro LED ML of green G and a separation distance between the micro LED ML of green G and the micro LED ML of blue B are formed differently.

In this case, electrical connection between the micro LEDs MLs and the substrate P may be achieved via vertical conductive parts 200a that are in contact with at least a portion of each of the electrodes E of the substrate P and in contact with at least a portion of each of the terminals of the micro LEDs MLs. However, more effective electrical connection may be achieved by the horizontal conductive part 200b.

In detail, as illustrated in FIG. 8A, at least a portion of the horizontal conductive part 200b may be formed in a vertical projection area of the micro LED ML of red R. Further, at least a portion of the horizontal conductive part 200b may be formed in a vertical projection area of the electrode E1.

Due to this structure, the vertical projection area of the horizontal conductive part 200b may be formed to overlap with the vertical projection area of the micro LED ML of red R and overlap with the vertical projection area of the electrode E1 of the substrate P. Since the horizontal conductive part 200b is formed to be connected to the vertical conductive parts 200a, this structure makes it possible to electrically connect a bottom terminal of the micro LED ML of red R and the electrode E1 that are in an offset position.

As illustrated in FIG. 8A, at least a portion of the horizontal conductive part 200b may be formed in a vertical projection area of the micro LED ML of green G. Further, at least a portion of the horizontal conductive part 200b may be formed in a vertical projection area of the electrode E2.

Due to this structure, the vertical projection area of the horizontal conductive part 200b may be formed to overlap with the vertical projection area of the micro LED ML of green G and overlap with the vertical projection area of the electrode E2 of the substrate P. This makes it possible to electrically connect a bottom terminal of the micro LED ML of green G and the electrode E2 that are in an offset position.

Further, as illustrated in FIG. 8A, at least a portion of the horizontal conductive part 200b may be formed in a vertical projection area of the micro LED ML of blue B. Further, at least a portion of the horizontal conductive part 200b may be formed in a vertical projection area of the electrode E3. Due to this structure, the vertical projection area of the horizontal conductive part 200b may be formed to overlap with the vertical projection area of the micro LED ML of blue B and overlap with the vertical projection area of the electrode E3 of the substrate P. This makes it possible to electrically connect a bottom terminal of the micro LED ML of blue B and the electrode E3 that are in an offset position.

As such, even if the micro LEDs MLs of different sizes are mounted on the circuit board 300 provided with the electrodes E1, E2, and E3 in positions offset from the positions of the terminals S of the micro LEDs MLs, effective electrical connection may be achieved by the horizontal conductive parts 200b of the anodic oxide film 200 for electric contact.

Additionally, since the anodic oxide film 200 for electric contact has a non-conductive property in the horizontal direction therein, this may prevent a negative problem such as an electrical short due to a short separation distance between the micro LEDs MLs. In detail, the separation distances between the micro LEDs MLs may be formed differently due to different sizes of the micro LEDs MLs, so that a relatively shorter separation distance may be formed between parts of the micro LEDs MLs. In this case, a micro LED ML mounting area of the anodic oxide film 200 for electric contact has conductivity only in the vertical direction, and thus an electrical short problem that may occur due to a short separation distance between the micro LEDs MLs may be prevented.

Meanwhile, in FIGS. 8B and 8C, micro LEDs MLs of red R, green G, and blue B are formed in different sizes. Further, electrodes E1, E2, and E3 for electrically connecting to the respective micro LEDs MLs are formed on the substrate P in positions offset from the micro LEDs MLs.

Also in this case, each of horizontal conductive parts 200b may be formed to overlap with a vertical projection area of each of the micro LEDs MLs, which are optical elements 100, and overlap with a vertical projection area of each of the electrodes E1, E2, and E3 of the substrate P, thereby electrically connecting terminals S of the optical elements 100 and electrodes E of the substrate P that are in an offset position.

In the case of the anodic oxide film 200 for electric contact according to the present invention, the vertical conductive parts 200a are provided in all of the pores 400a having a short separation distance. Thus, by forming the horizontal conductive parts 200b in a structure connected to the vertical conductive parts 200a on the surface of the anodic oxide film 400 so that the vertical projection areas of the horizontal conductive parts 200b overlap with the vertical projection areas of the optical elements 100 and the substrate P as described above, it is possible to enable the terminals S of the optical elements 100 and the electrodes E of the substrate P to be electrically connected to each other to enable interconnection even in an offset position.

FIG. 9 is a view illustrating an anodic oxide film 200 for electric contact having a plurality of layers of anodic oxide films 400. In FIG. 9, as one example, an optical element 100 is illustrated and described as being a flip-type micro LED ML having terminals S formed on a bottom surface thereof. Further, in FIG. 9, the anodic oxide films 400 are illustrated as being composed of two layers, but the number of the anodic oxide films 400 is not limited thereto.

As shown in FIG. 9, the anodic oxide film 200 for electric contact may include the plurality of layers of anodic oxide films 400.

Electrodes E1' and E2' provided on the circuit board 300 electrically connected to the micro LED ML may be formed to have a longer separation distance than the terminals S of the micro LED ML. In other words, a difference may exist between the distance the electrodes E1' and E2' of the substrate P and the distance between the terminals S of the optical element 100. Thus, the positions of the terminals S of the micro LED ML and the positions of the electrodes E1' and E2' of the circuit board 300 may be offset from each other.

In this case, due to the provision of the plurality of layers of the anodic oxide films 400, the anodic oxide film 200 for electric contact may compensate for the difference between the separation distance between the terminals S of the micro LED ML and the separation distance between the electrodes E1' and E2' of the circuit board 300 thereby achieving electrical connection between the micro LED ML and the circuit board 300.

In detail, as one example, among the plurality of layers of anodic oxide films 400 in FIG. 9, an anodic oxide film 400 having vertical conductive parts 200a to which the terminals S of the micro LED ML are substantially joined may be a first anodic oxide layer 210. A second anodic oxide layer 220 having vertical conductive parts 200a that are substantially joined to the electrodes E1' and E2' of the circuit board 300 may be provided below the first anode oxide layer 210.

The first anodic oxide layer 210 may be configured such that the respective vertical conductive parts 200a are provided inside at least a part of a plurality of pores 400a. In this case, at least a part of the pores 400a having the vertical conductive parts 200a may be pores 400a that are in positions corresponding to the terminals S of the micro LED ML. In other words, the first anodic oxide layer 210 may be provided with the vertical conductive parts 200a in positions corresponding to the terminals S of the micro LED ML.

The second anodic oxide layer 220 may be configured such that the respective vertical conductive parts 200a are provided inside at least a part of a plurality of pores 400a. In this case, at least a part of the pores 400a having the vertical conductive parts 200a may be pores 400a that are in positions corresponding to the electrodes E1' and E2' of the circuit board 300. Thus, the second anodic oxide layer 220 may be provided with the vertical conductive parts 200a in positions corresponding to the electrodes E1' and E2' of the circuit board 300.

The first and second anodic oxide layers 210 and 220 as described above may have a shape joined together by a joining material 200c and laminated.

A horizontal conductive part 200b electrically connecting each of the terminals S of the micro LED ML and an associated one of the electrodes E1' and E2' of the substrate P may be provided between the first and second anodic oxide layers 210 and 220. In this case, the horizontal conductive part 200b may be composed of first and second horizontal conductive parts 200b' and 200b".

In the flip-type micro LED ML illustrated in FIG. 9, a first terminal 106 and a second terminal 107 may be provided on the bottom surface thereof. In this case, between the first and second anodic oxide layers 210 and 220, the first horizontal conductive part 200b' electrically connecting the first terminal 106 and a first electrode E1' associated therewith, and the second horizontal conductive part 200b electrically connecting the second terminal 107 and a second electrode E2 associated therewith may be provided.

The first horizontal conductive part 200b' may be configured to include: a vertical conductive part existence area existing in the area that is in contact with the first terminal 106; an area corresponding to a vertical conductive part existence area existing in the area that is in contact with the first electrode E1'; and an area defined by the difference in distance between the first terminal 106 and the first electrode E1'. Due to the first horizontal conductive part 200b', the difference in distance between the first terminal 106 and the first electrode E1' may be compensated, and thus the first terminal 106 and the first electrode E1' may be electrically connected to each other.

Further, the second horizontal conductive part 200b" may be configured to include: a vertical conductive part existence area existing in the area that is in contact with the second terminal 107; an area corresponding to a vertical conductive part existence area existing in the area that is in contact with the second electrode E2'; and an area defined by the difference in distance between the second terminal 107 and the second electrode E2'. Due to the second horizontal conductive part 200b", the difference in distance between the second terminal 107 and the second electrode E2' may be compensated, and thus the second terminal 107 and the second electrode E2' may be electrically connected to each other.

As described above, the anodic oxide film 200 for electric contact having the plurality of layers of anodic oxide films 400 may achieve an effective electrical connection between the micro LED ML and the circuit board 300 by compensating for the difference in distance between the terminals S of the micro LED ML and the electrodes E of the circuit board 300. Due thereto, the distance between the first and second electrodes E1' and E2' of the circuit board 300 may be formed to be larger than the distance between the first and second terminals 106 and 107 of the micro LED ML.

In the previous description with reference to FIG. 9, the vertical conductive parts 200a of each anodic oxide layer are illustrated as being provided in at least a part of all of the pores 400a, but the present invention is not limited thereto. For example, the vertical conductive parts 200a may be provided in all of the pores 400a.

In this case, the formation area of the horizontal conductive part 200b may be formed in the same area as the area for connection of the vertical conductive parts 200a provided in at least a part of the pores of 400a of each layer.

A plurality of anodic oxide films 200 for electric contact may be provided, and the horizontal conductive part 200b may be provided between anodic oxide films 400 adjacent to each other from top to bottom. The plurality of anodic oxide films 200 for electric contact as described above may compensate for the difference in distance between the terminals S of the optical element 100 and the electrodes E of the substrate P. This makes it possible to mount the optical element 100 on the substrate P regardless of the size of the optical element 100 electrically connected to the substrate P.

Hereinafter, a method of manufacturing an optoelectronic display having an anodic oxide film 200 for electric contact will be described. The method of manufacturing the optoelectronic display includes: providing a substrate P; providing an anodic oxide film 200 for electric contact having a vertical conductive part 200a and a horizontal conductive part 200b, on the substrate P; and mounting an optical element 100 on the anodic oxide film 200 for electric contact.

First, the substrate P on which the anodic oxide film 200 for electric contact may be provided. The substrate P may be, as one example, a circuit board 300.

Then, the anodic oxide film 200 for electric contact having the vertical conductive part 200a and the horizontal conductive part 200b may be provided on the substrate P. The anodic oxide film 200 for electric contact provided on the substrate P may be manufactured by the method of manufacturing the anodic oxide film 200 for electric contact as described above with reference to FIGS. 5A, 5B, 5C, 5D-1, and 5D-2.

Then, the optical element 100 may be mounted on the anodic oxide film 200 for electric contact. The mounting of the optical element 100 on the anodic oxide film 200 for electric contact may be performed by melting the vertical conductive part 200a to electrically connect a terminal S of the optical element 100 and an electrode E of the substrate P and to simultaneously fix the optical element 100 to the substrate P.

In this case, the vertical conductive part 200a may be configured to include a protruding portion 203 protruding from the surface of an anodic oxide film 400, or may be configured as a non-protruding structure. The vertical conductive part 200a may be configured to include first and second metal parts 201 and 202. In this case, the second metal part 202 may be melted to join the optical element 100.

In the method of manufacturing the optoelectronic display, the anodic oxide film 200 for electric contact may be provided on the substrate P after the optical element 100 is mounted on the anodic oxide film 200 for electric contact. Alternatively, the anodic oxide film 200 for electric contact may be provided on the substrate P and then the optical element 100 is mounted on the anodic oxide film 200 for electric contact.

As described above, the anodic oxide film 200 for electric contact according to the present invention may form conductivity only in the vertical direction therein due to the vertical conductive parts 200*a* formed inside the pores 400*a*. This makes it possible to provide a design that does not negatively affect luminous efficacy regardless of the type of the optical element 100 (e.g., a micro LED ML, a general LED, and a mini LED), thereby providing an effective electrical connection between the terminal S of the optical element 100 and the electrode E of the substrate P.

As described above, the present invention has been described with reference to exemplary embodiments. However, those skilled in the art will appreciate that various modifications, additions and substitutions are possible, without departing from the scope and spirit of the invention as disclosed in the accompanying claims.

What is claimed is:

1. An anodic oxide film for electric contact, the anodic oxide film being provided between an optical element and a substrate to electrically connect a terminal of the optical element and an electrode of the substrate, the anodic oxide film comprising:
   a plurality of vertical conductive parts penetrating the anodic oxide film;
   a horizontal conductive part formed on a surface of the anodic oxide film and connected to a first plurality of vertical conductive parts among the plurality of vertical conductive parts; and
   an insulating part formed on the surface of the anodic oxide film,
   wherein the terminal of the optical element and the electrode of the substrate are electrically connected to each other by the first plurality of vertical conductive parts and the horizontal conductive part,
   wherein the anodic oxide film comprises a pore formed when anodizing a metal base material, and
   each of the plurality of vertical conductive parts is formed inside the pore, and
   wherein each of the plurality of vertical conductive parts comprises a protruding portion protruding from the surface of the anodic oxide film.

2. The anodic oxide film of claim 1, wherein the anodic oxide film is provided as a plurality of layers.

3. The anodic oxide film of claim 1, wherein each of the plurality of vertical conductive parts comprises at least one of:
   a first metal part including at least one of Au, Ag, Cu, and Ni; and
   a second metal part made of a metal that melts at a temperature lower than a melting temperature of the first metal part.

4. The anodic oxide film of claim 3, wherein the second metal part comprises an Sn-based solder.

5. The anodic oxide film of claim 3, wherein the second metal part is formed on the first metal part, and
   the second metal part protrudes from the surface of the anodic oxide film.

6. An anodic oxide film for electric contact, the anodic oxide film being provided between an optical element and a substrate to electrically connect a terminal of the optical element and an electrode of the substrate, the anodic oxide film comprising:
   a plurality of vertical conductive parts penetrating the anodic oxide film;
   a horizontal conductive part formed on a surface of the anodic oxide film and connected to a first plurality of vertical conductive parts among the plurality of vertical conductive parts; and
   an insulating part formed on the surface of the anodic oxide film,
   wherein the terminal of the optical element and the electrode of the substrate are electrically connected to each other by the first plurality of vertical conductive parts and the horizontal conductive part,
   wherein the anodic oxide film comprises a pore formed when anodizing a metal base material and a through-hole formed to have a larger diameter than the pore, and
   each of the plurality of vertical conductive parts is formed inside the through-hole, and
   wherein each of the plurality of vertical conductive parts comprises a protruding portion protruding from the surface of the anodic oxide film.

7. An optoelectronic display, comprising:
   an optical element;
   a substrate; and
   an anodic oxide film for electric contact provided between the optical element and the substrate,
   wherein the anodic oxide film for electric contact comprises:
   a plurality of vertical conductive parts penetrating the anodic oxide film;
   a horizontal conductive part formed on a surface of the anodic oxide film and connected to a first plurality of vertical conductive parts among the plurality of vertical conductive parts; and
   an insulating part formed on the surface of the anodic oxide film,
   wherein the anodic oxide film for electric contact is configured to electrically connect a terminal of the optical element to an electrode of the substrate through the first plurality of vertical conductive parts and the horizontal conductive part,
   wherein the anodic oxide film comprises a pore formed when anodizing a metal base material, and
   each of the plurality of vertical conductive parts is formed inside the pore, and
   wherein each of the plurality of vertical conductive parts comprises a protruding portion protruding from the surface of the anodic oxide film.

8. The optoelectronic display of claim 7, wherein the anodic oxide film for electric contact is provided as a plurality of anodic oxide films, and
   the horizontal conductive part is provided between anodic oxide films adjacent to each other from top to bottom.

9. The optoelectronic display of claim 7, wherein each of the plurality of vertical conductive parts comprises an Sn-based solder.

10. The optoelectronic display of claim 7, wherein the optical element is a micro LED.

11. An anodic oxide film for electric contact, the anodic oxide film being provided between an optical element and a substrate to electrically connect first and second terminals formed on a bottom surface of the optical element and first and second electrodes of the substrate, wherein the first and second electrodes of the substrate have a longer separation distance than the first and second terminals of the optical element, the anodic oxide film comprising:
   a plurality of vertical conductive parts penetrating the anodic oxide film; and a horizontal conductive part formed on a surface of the anodic oxide film, wherein the horizontal conductive part includes a first horizontal conductive part connected to a first plurality of vertical conductive parts among the plurality of vertical conductive parts and a second horizontal conductive part connected to a second plurality of vertical conductive parts among the plurality of vertical conductive parts, and the second horizontal conductive part is spaced from the first horizontal conductive part; and an insulating part formed on the surface of the anodic oxide film, wherein the first terminal of the optical element and the first electrode of the substrate are electrically connected to each other by the first plurality of vertical conductive parts and the first horizontal conductive part, wherein the second terminal of the optical element and the second electrode of the substrate are electrically connected to each other by the second plurality of vertical conductive parts and the second horizontal conductive part, and wherein the anodic oxide film comprises a pore formed when anodizing a metal base material, and each of the plurality of vertical conductive parts is formed inside the pore.

12. An anodic oxide film for electric contact, the anodic oxide film being provided between an optical element and a substrate to electrically connect first and second terminals formed on a bottom surface of the optical element and first and second electrodes of the substrate, wherein the first and second electrodes of the substrate have a longer separation distance than the first and second terminals of the optical element, the anodic oxide film comprising:

a plurality of vertical conductive parts penetrating the anodic oxide film; and a horizontal conductive part formed on a surface of the anodic oxide film, wherein the horizontal conductive part includes a first horizontal conductive part connected to a first plurality of vertical conductive parts among the plurality of vertical conductive parts and a second horizontal conductive part connected to a second plurality of vertical conductive parts among the plurality of vertical conductive parts, and the second horizontal conductive part is spaced from the first horizontal conductive part; and an insulating part formed on the surface of the anodic oxide film, wherein the first terminal of the optical element and the first electrode of the substrate are electrically connected to each other by the first plurality of vertical conductive parts and the first horizontal conductive part, wherein the second terminal of the optical element and the second electrode of the substrate are electrically connected to each other by the second plurality of vertical conductive parts and the second horizontal conductive part, and wherein the anodic oxide film comprises a pore formed when anodizing a metal base material and a through-hole formed to have a larger diameter than the pore, and each of the plurality of vertical conductive parts is formed inside the through-hole.

* * * * *